(12) United States Patent
Kanryo et al.

(10) Patent No.: US 10,005,150 B2
(45) Date of Patent: Jun. 26, 2018

(54) METHOD FOR MANUFACTURING ELECTRONIC DEVICE (71) Applicant: MURATA MANUFACTURING CO., LTD., Nagaokakyo-Shi, Kyoto-fu (JP)

(72) Inventors: Koichi Kanryo, Nagaokakyo (JP); Hiroki Endo, Nagaokakyo (JP); Hideyuki Fujiki, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days. days.

(21) Appl. No.: 14/610,560

(22) Filed: Jan. 30, 2015

(65) Prior Publication Data

US 2015/0136839 A1 May 21, 2015

Related U.S. Application Data

(63) Continuation of application No. PCT/JP2013/069095, filed on Jul. 12, 2013.

(30) Foreign Application Priority Data

Aug. 3, 2012 (JP) ................................. 2012-172453

(51) Int. Cl.
*B23K 20/10* (2006.01)
*H05K 13/04* (2006.01)
*H01M 2/30* (2006.01)
*H01G 11/84* (2013.01)
*H01G 13/00* (2013.01)
(Continued)

(52) U.S. Cl.
CPC .......... *B23K 20/106* (2013.01); *B23K 20/002* (2013.01); *B23K 20/10* (2013.01); *H01G 4/228* (2013.01); *H01G 11/84* (2013.01); *H01G 13/00* (2013.01); *H01G 13/006* (2013.01);
(Continued)

(58) Field of Classification Search
None
See application file for complete search history.

(56) References Cited

U.S. PATENT DOCUMENTS 6,824,630 B2 * 11/2004 Oishi ................... B23K 20/106
156/580.2
7,017,791 B2 3/2006 Higashiyama
(Continued)

FOREIGN PATENT DOCUMENTS

CN 1490859 A 4/2004
JP 05115986 A * 5/1993
(Continued)

OTHER PUBLICATIONS

Written Opinion and International Search Report issued in PCT/JP2013/069095 dated Oct. 15, 2013.

*Primary Examiner* — Devang R Patel
(74) *Attorney, Agent, or Firm* — Arent Fox LLP (57) ABSTRACT

A method for manufacturing an electronic device using ultrasonic joining, when the component members of the electronic device includes different structures. The method includes obtaining a joining condition that provides press-down amounts for the materials to be joined at predetermined values. The press-down amount generated by a horn and a supporting member biting into the materials during ultrasonic joining is predetermined for each specific structure of the component member of the electronic device.

2 Claims, 5 Drawing Sheets

(51) Int. Cl.
*H01G 4/228* (2006.01)
*B23K 20/00* (2006.01)
*H01M 10/0525* (2010.01)

(52) U.S. Cl.
CPC ............ *H01M 2/30* (2013.01); *H05K 13/046* (2013.01); *H01M 10/0525* (2013.01); *Y02E 60/13* (2013.01)

(56) References Cited

U.S. PATENT DOCUMENTS

| | | | | |
|---|---|---|---|---|
| 7,134,588 | B2* | 11/2006 | Kobae | B23K 20/10 156/580.2 |
| 2003/0160084 | A1* | 8/2003 | Higashiyama | B06B 3/00 228/1.1 |
| 2004/0041003 | A1* | 3/2004 | Higashiyama | H01L 21/67144 228/110.1 |
| 2004/0178486 | A1* | 9/2004 | Maeda | H01L 24/81 257/678 |
| 2010/0015466 | A1* | 1/2010 | Yoshioka | B23K 20/10 428/615 |
| 2013/0112332 | A1* | 5/2013 | Spicer | B23K 20/10 156/64 |

FOREIGN PATENT DOCUMENTS

| | | | |
|---|---|---|---|
| JP | H10-175083 A | 6/1998 | |
| JP | 2005-088067 A | 4/2005 | |
| JP | 2006-263816 A | 10/2006 | |
| JP | 2010-029873 A | 2/2010 | |
| JP | WO 2011092809 A1 * | 8/2011 | ............ B23K 20/10 |
| JP | 2012-079427 A | 4/2012 | |

* cited by examiner

| | | PRESS-DOWN AMOUNT (μm) | | | | | |
|---|---|---|---|---|---|---|---|
| | | 100 | 120 | 140 | 160 | 180 | 200 |
| TERMINAL | A | UNJOINED | OK | OK | BROKEN | BROKEN | BROKEN |
| | B | UNJOINED | UNJOINED | UNJOINED | OK | OK | BROKEN |
| | ⋮ | ⋮ | ⋮ | ⋮ | ⋮ | ⋮ | ⋮ |

METHOD FOR MANUFACTURING ELECTRONIC DEVICE

CROSS REFERENCE TO RELATED APPLICATIONS

The present application is a continuation of PCT/JP2013/069095 filed Jul. 12, 2013, which claims priority to Japanese Patent Application No. 2012-172453, filed Aug. 3, 2012, the entire contents of each of which are incorporated herein by reference.

FIELD OF THE INVENTION

The present invention relates to a method for manufacturing an electronic device provided with a plurality of component members (external terminals) formed by bonding metal plates by ultrasonic joining.

BACKGROUND OF THE INVENTION

There is an ultrasonic joining method for joining materials to be joined together by ultrasonic vibration in a horizontal direction while applying pressure to a joining surface between the materials to be joined (see, for example, Patent Document 1). In the ultrasonic joining method described in Patent Document 1, there are a plurality of sets of materials to be joined, and the plurality of sets of materials to be joined can be joined together collectively, and at this time, a variation occurring in a joining state for each set of the materials to be joined due to generating a difference in the distance from the center of a horn to each welding point for each set of the materials to be joined can be prevented.

When a plurality of materials to be joined are collectively joined, if the energy generated by the vibration in each set of the materials to be joined is different, a variation occurs in the joining state of the materials to be joined, and a variation occurs in quality of a joint of each set of the materials to be joined. Therefore, in the ultrasonic joining method described in Patent Document 1, each of distances from a center point of an arc-shaped ultrasonic horn to joining points is made equal by disposing the joining points around the horn. This enables to avoid a variation occurring in the magnitude of vibration at each of the joining points during the vibration of the ultrasonic horn, and not to generate any difference in the joining state of each joint.

Patent Document 1: Japanese Unexamined Patent Application Publication No. H10-175083

SUMMARY OF THE INVENTION

Meanwhile, in the ultrasonic joining method, the materials to be joined are securely fixed by being sandwiched under pressure between a horn and an anvil, and the vibration is transmitted to the materials to be joined. In the ultrasonic joining method described in Patent Document 1, the distance between the center of the horn and the anvil is the same in any of the joining points, and therefore, when a plurality of materials to be joined are of the same type or the same size, the pressure applied by the horn and the anvil is the same for any of the materials to be joined.

However, in each joint, when a material of each of the materials to be joined is different, or a thickness of the material to be joined itself is different, or the number of the materials to be joined is different, or these cases are mixed, pressure required for joining to be applied by the horn and the anvil is different in each joint. For example, when pressure is applied based on a thick joint, a thin joint cannot be reliably joined because of the lack of sufficient pressure, and joining failure occurs. On the other hand, when pressure is applied based on a thin joint, pressure more than necessary is applied to a thick joint by the horn and the anvil, and damage such as breakage occurs in the material to be joined.

SUMMARY OF THE INVENTION

Then, an object of the present invention is to provide a method for manufacturing an electronic device, the method capable of preventing joining failure, destruction of materials to be joined, and the like when a plurality of component members of the electronic device which are formed by bonding the materials to be joined are manufactured by ultrasonic joining.

According to the present invention, there is provided a method for manufacturing an electronic device, the method including manufacturing at least one component member of an electronic device by laminating materials to be joined, sandwiching the materials to be joined between at least one protruding portion of a horn and a supporting portion in a laminating direction, and joining ultrasonically the laminated material to be joined by the at least one protruding portion of the horn and the supporting portion while vibrating the horn, the method including: when the at least one component member of the electronic device includes a first structure and a second structure, obtaining a joining condition that leads a press-down amount into the materials to be joined to a predetermined value, the press-down amount generated by each of the at least one protruding portion of the horn and the supporting portion biting into the material to be joined during the ultrasonic joining, as a first joining condition and a second joining condition respectively corresponding to the first structure and the second structure of the at least one component member of the electronic device to be manufactured, from storage means storing the joining condition for each of the first and the second structure of the at least one component member of the electronic device; and manufacturing the at least one component member of the electronic device having the first structure and the second structure by joining ultrasonically the laminated materials to be joined respectively corresponding to the first structure and the second structure based on the obtained first joining condition and the obtained second joining condition.

In this method, the materials to be joined are joined by controlling the press-down amount to a proper value. When the joining state of the materials to be joined is good, as a consequence, the press-down amount of the protruding portion and the like of the horn to the materials to be joined tends to be in a constant range. When the press-down amount is too small, the material to be joined becomes unjoined, and the joining strength is insufficient. In addition, when the press-down amount is too large, the damage to the material to be joined is large, or the material to be joined adheres to the protruding portion of the horn. Therefore, by controlling the press-down amount to a proper value, sufficient joining strength between the materials to be joined can be obtained, and the damage to the materials to be joined and adhesion of the materials to be joined to the protruding portion of the horn can be prevented.

In addition, by measuring the press-down amount so as to control the press-down amount to a proper value, determining the joined state is facilitated because the joined state of the manufactured component members of the electronic device can be grasped.

When the horn includes a plurality of protruding portions of the same structure, and when the at least one component member of the electronic device having the first structure includes a plurality of component members, the method may include sandwiching the plurality of laminated materials to be joined corresponding to the component members of the electronic device having the first structure between each of the plurality of protruding portions and the supporting portion, and joining the laminated materials to be joined collectively based on the joining condition corresponding to the first structure.

In this method, when a plurality of component members of the electronic device are manufactured, if there are component members having the same joining condition, the component members are manufactured by joining the corresponding materials to be joined collectively by a plurality of protruding portions. Thereby, the manufacturing time can be shortened without degrading the joining quality.

The method may include sandwiching the laminated materials to be joined corresponding to the at least one component member of the electronic device having the second structure between any one of the plurality of protruding portions and the supporting portion, and joining the laminated materials to be joined based on the joining condition corresponding to the second structure.

In this method, when a plurality of component members of an electronic device are manufactured, if there are component members having the same joining condition, the corresponding materials to be joined are joined collectively by a plurality of protruding portions, and for a component member different in the joining condition, the component member is manufactured using any one of the plurality of protruding portions. Thereby, the manufacturing time can be further shortened without degrading the joining quality.

According to the present invention, by controlling the press-down amount to a proper value when the materials to be joined are joined, sufficient joining strength between the materials to be joined can be obtained, and the damage to the materials to be joined and adhesion of the material to be joined to the protruding portion of the horn can be prevented.

DETAILED DESCRIPTION OF THE EXEMPLARY EMBODIMENTS

A method for manufacturing an electronic device according to the present invention is a method for manufacturing an electronic device such as an electric double layer capacitor, a film capacitor, or a lithium-ion secondary battery, and in particular is a method for manufacturing external terminals of an electronic device by bonding metal plates by ultrasonic joining. In the following, the electronic device will be described as an electric double layer capacitor.

First Embodiment

Figure 1A:
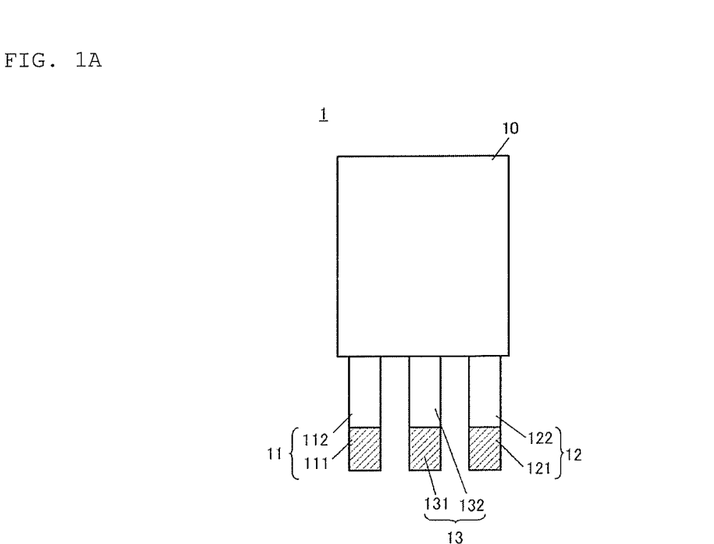
FIG. 1A is an external front view of an electric double layer capacitor according to a first embodiment.
Figure 1B:
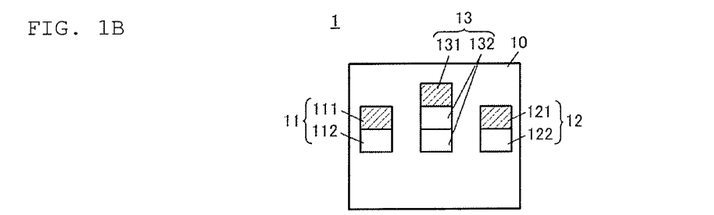
FIG. 1B is a plan view of the electric double layer capacitor according to the first embodiment when seen from a terminal side.

FIG. 1A is an external front view of an electric double layer capacitor according to the present embodiment, and FIG. 1B is a plan view of the electric double layer capacitor when seen from a terminal side.

An electric double layer capacitor 1 includes a container 10 of a box-type (which may be of a laminate pack type or a cylinder type) having an electrode layer inside, and three terminals of a positive electrode terminal 11, a negative electrode terminal 12, and a balance terminal 13 which are disposed approximately in a straight line as external terminals. The three terminals correspond to component members according to the present invention. Internal electrodes (positive and negative electrodes) of the electric double layer capacitor generally made of Al foil from an electrochemical request, and Al plates called tabs are attached to the internal electrodes by welding or the like so as to bring out the stored electric charge to the outside.

Furthermore, when the electric double layer capacitor is connected to an electronic circuit, a Cu plate is joined to the tab such that the connection by soldering is possible, and the joint of the tab being the Al plate and the Cu plate is made to be an external terminal. That is, each of the positive electrode terminal 11, the negative electrode terminal 12 and the balance terminal 13 is formed by the Cu plate and the Al plate being bonded by ultrasonic joining described below. Hereinafter, a laminating direction of the Cu plate and the Al plate is referred to as a "thickness direction of the terminal".

As described above, an Al plate 112 of the positive electrode terminal 11 is disposed in the container 10, and is connected to the positive electrode in the container 10. A Cu plate 111 is disposed at an end of the Al plate 112. Each of the Cu plate 111 and the Al plate 112 has a thickness of 100 μm. That is, an end portion of the positive electrode terminal 11 provided with the Cu plate 111 has a thickness of 200 μm.

An Al plate 122 of the negative electrode terminal 12 is disposed in the container 10, and is connected to the negative electrode in the container 10 in the same manner as the positive electrode terminal 11. A Cu plate 121 is disposed at an end of the Al plate 122. Each of the Cu plate 121 and the Al plate 122 has a thickness of 100 μm. That is, an end portion of the negative electrode terminal 12 provided with the Cu plate 121 has a thickness of 200 μm.

The balance terminal 13 is an external terminal for connecting a voltage balancing resistor, and an Al plate 132 is disposed in the container 10, and is connected to the electrode in the container 10. A Cu plate 131 is disposed at an end of the Al plate 132. The Cu plate 131 has a thickness of 100 μm, and the Al plate 132 has a structure in which two Al plates each of which has a thickness of 100 μm are laminated on top of each other, and therefore has a thickness of 200 μm in total. That is, an end portion of the balance terminal 13 provided with the Cu plate 111 has a thickness of 300 μm. That is, the positive electrode terminal 11 and the negative electrode terminal 12 correspond to a first structure according to the present invention, and the balance terminal 13 corresponds to a second structure according to the present invention.

In the following, the ultrasonic joining for joining the Cu plate and the Al plate will be described. In the laminated state, the Cu plate and the Al plate are sandwiched from the laminating direction by a horn and an anvil which are made of a material of an aluminum alloy, a titanium alloy, a heat treated iron alloy, or the like. By the horn being pressed to the anvil side in that state while being vibrated in a direction perpendicular to the laminating direction, the Cu plate and the Al plate are ultrasonically joined.

Figure 2A:
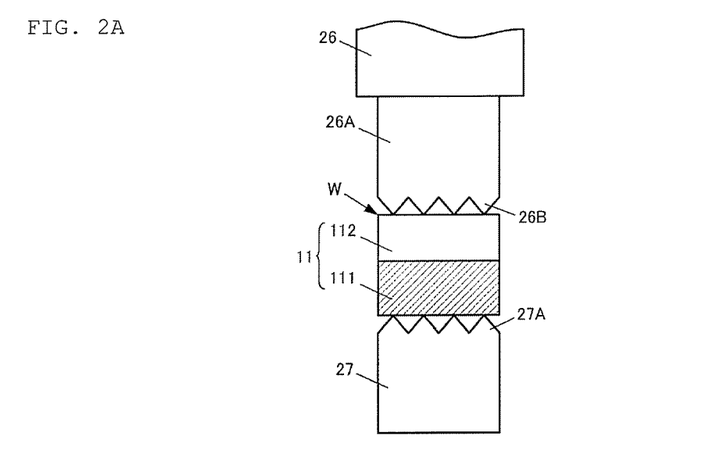
FIG. 2A is a diagram for illustrating a horn and an anvil, showing a state where a protruding portion of the horn and the anvil abut against a Cu plate and an Al plate.
Figure 2B:
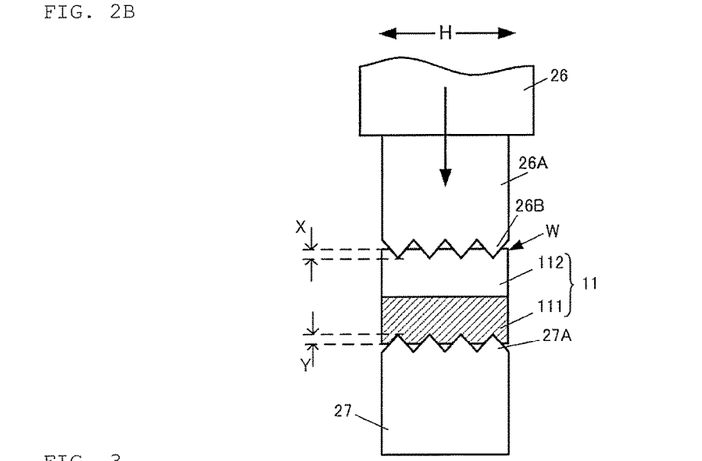
FIG. 2B is a diagram for illustrating the horn and the anvil, showing a state where the horn is pressed to an anvil side while being vibrated.

FIGS. 2A and 2B are diagrams for illustrating the horn and the anvil, and FIG. 2A shows a state where the protruding portion of the horn and the anvil abut against the Cu plate and the Al plate, and FIG. 2B shows a state where the horn is pressed to the anvil side while being vibrated. FIGS. 2A and 2B show a state of the electric double layer capacitor 1 when seen from the terminal side, that is, a state corresponding to FIG. 1B. In FIGS. 2A and 2B, the positive electrode terminal 11 will be described.

A horn 26 and an anvil 27 are made of a material of an aluminum alloy, a titanium alloy, a heat-treated iron alloy, or the like. The anvil 27 is a receiving metal fitting, and the Cu plate 111 and the Al plate 112 are placed on the anvil 27 such that the Cu plate 111 and the Al plate 112 are laminated with the Cu plate 111 located on the lower side. Hereinafter, the material to be joined such that the Cu plate and the Al plate laminated together are placed on the anvil 27 is referred to as a workpiece W. A surface of the anvil 27 on which the workpiece W is placed is provided with a plurality of protrusions 27A with pointed ends.

The horn 26 is cylindrical or prismatic, and has a protruding portion 26A protruding to the anvil 27 side in a portion opposite to the anvil 27 in part of the side surface of a cylinder or a prism. At an end of the protruding portion 26A on the anvil 27 side, a plurality of protrusions 26B with pointed ends are formed. The horn 26 presses the protruding portion 26A against the workpiece W from above so that the workpiece W is sandwiched between the horn 26 and the anvil 27.

In a state of sandwiching the workpiece W between the horn 26 and the anvil 27, the horn 26 vibrates in a horizontal direction H perpendicular to the laminating direction while pressing the workpiece W to the anvil 27 side. Then, as shown in FIG. 2B, the pointed ends of the protrusions 26B of the horn 26 bite into the Al plate 112, and the pointed ends of the protrusions 27A of the anvil 27 bite into the Cu plate 111. Hereinafter, an amount of bite of the protrusions 26B and the protrusions 27A into the workpiece W is referred to as a press-down amount of the workpiece W.

When assuming that the amount of bite of the protrusions 26B into the Al plate 112 is X, and that the amount of bite of the protrusions 27A into the Cu plate 111 is Y, the press-down amount is X+Y. The horn 26 is press- and vibration-controlled such that the press-down amount of the workpiece W is consequently an optimal value.

Figure 3:
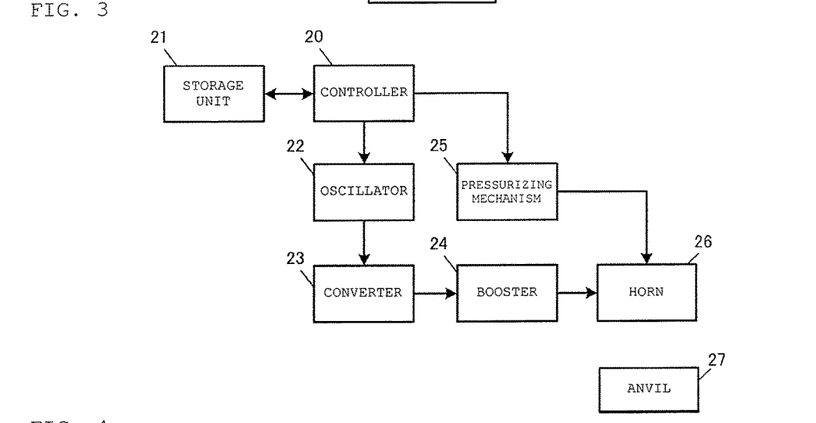
FIG. 3 is a block diagram showing a configuration of an ultrasonic joining device for performing ultrasonic joining according to the first embodiment.

FIG. 3 is a block diagram showing a configuration of an ultrasonic joining device for performing ultrasonic joining according to the present embodiment. The ultrasonic joining device includes a controller 20, a storage unit 21, an oscillator 22, a converter 23, a booster 24, a pressurizing mechanism 25, the horn 26, and the anvil 27.

The storage unit 21 stores a joining condition of the workpiece W to be ultrasonically joined. The joining condition is a condition under which the Cu plate and the Al plate of the workpiece W are optimally joined, and vibration amplitude [μm] of the horn 26, vibration time [ms], load [N] to the workpiece W by the horn 26, and the like are determined for each type of the workpiece W. When the horn 26 is driven and controlled under the joining condition corresponding to the workpiece W to be joined, as a consequence, the press-down amount [μm] of the workpiece W becomes a value appropriate to the workpiece W.

The controller 20 reads out the joining condition corresponding to the workpiece W to be joined from the storage unit 21, and specifies a current value and a voltage value based on the joining condition to the oscillator 22.

The oscillator 22 vibrates the converter 23 at the specified current value and voltage value. By increasing or decreasing the vibration (amplitude) transmitted from the converter 23, the booster 24 transmits its output to the horn 26. Thereby, the horn 26 vibrates with optimum amplitude for the workpiece W to be joined.

In addition, the controller 20 drives and controls the pressurizing mechanism 25 based on the obtained joining condition. The pressurizing mechanism 25 presses the horn 26 to the anvil 27 side such that a load optimal for the material of the workpiece W to be joined is applied to the workpiece W. It should be noted that the pressurizing mechanism 25 may be configured to press the anvil 27 to the horn 26 side.

Figure 4:
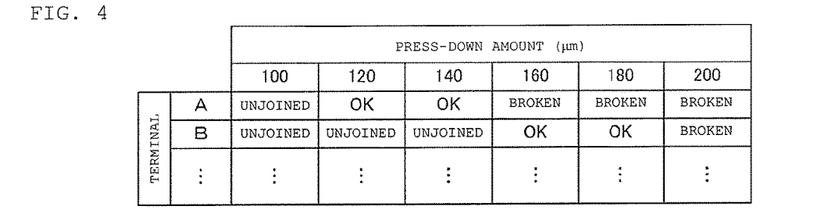
FIG. 4 is a diagram showing an example of a relationship between a press-down amount of a workpiece and a joining property.

The joining condition stored in the storage unit 21 is determined based on the press-down amount of the workpiece W so as to improve joining reliability (joining property) of the workpiece W. FIG. 4 is a diagram showing an example of a relationship between the press-down amount of the workpiece W and the joining property. FIG. 4 shows a table of the joining property when the press-down amount [μm] is changed for types of the workpiece W such as a terminal A and a terminal B. The result of the table is different depending on the joining condition.

The types of the workpiece W include metal plates constituting the workpiece W (such as the Cu plate and the Al plate), the thickness of each metal plate, and the like. For example, the terminal A is a terminal made of a Cu plate and an Al plate each of which has a thickness of 100 μm and whose surfaces Ni plating and Au plating are applied, and corresponds to a first structure according to the present invention. In addition, the terminal B is a terminal made of a Cu plate having a thickness of 100 μm and Al plates having a thickness of two sheets of a thickness of 100 μm, and corresponds to a second structure according to the present invention. In addition, the joint area of the Cu plate and the Al plate is assumed to be 1.5 mm×1.0 mm.

In FIG. 4, "OK" shows that joining strength of the Cu plate and the Al plate is high, and that a base material (workpiece W) becomes destroyed, and in addition shows the optimal press-down amount of the workpiece W (the predetermined value of the present invention) where terminal material (Cu plate, etc.) damage after joining is also lowered. "Unjoined" shows the press-down amount by which the workpiece W where the Cu plate and the Al plate are not sufficiently joined is formed. In addition, "Broken" shows the press-down amount that causes defective quality of the workpiece W by the Cu plate or the Al plate being broken at the time of joining.

Assume that the joining condition corresponding to the terminal A is such that the vibration amplitude is 10 to 20 μm, the load is 10 to 20 N, and the joining time is 130 to 180 ms. When the workpiece W to be joined is included in the terminal A, the press-down amount of the workpiece W is 120 [μm] or 140 [μm] by driving and controlling the horn 26 under the corresponding joining condition. That is, the joining condition corresponding to the terminal A corresponds to a first joining condition according to the present invention.

In addition, assume that the joining condition corresponding to the terminal B is such that the amplitude is 10 to 20 μm, the load is 10 to 20 N, and the joining time is 130 to 230 ms. When the workpiece W to be joined is included in the terminal B, the press-down amount of the workpiece W is 160 [μm] or 180 [μm] by driving and controlling the horn 26 under the corresponding joining condition. That is, the joining condition corresponding to the terminal B corresponds to a second joining condition according to the present invention.

Figure 5:
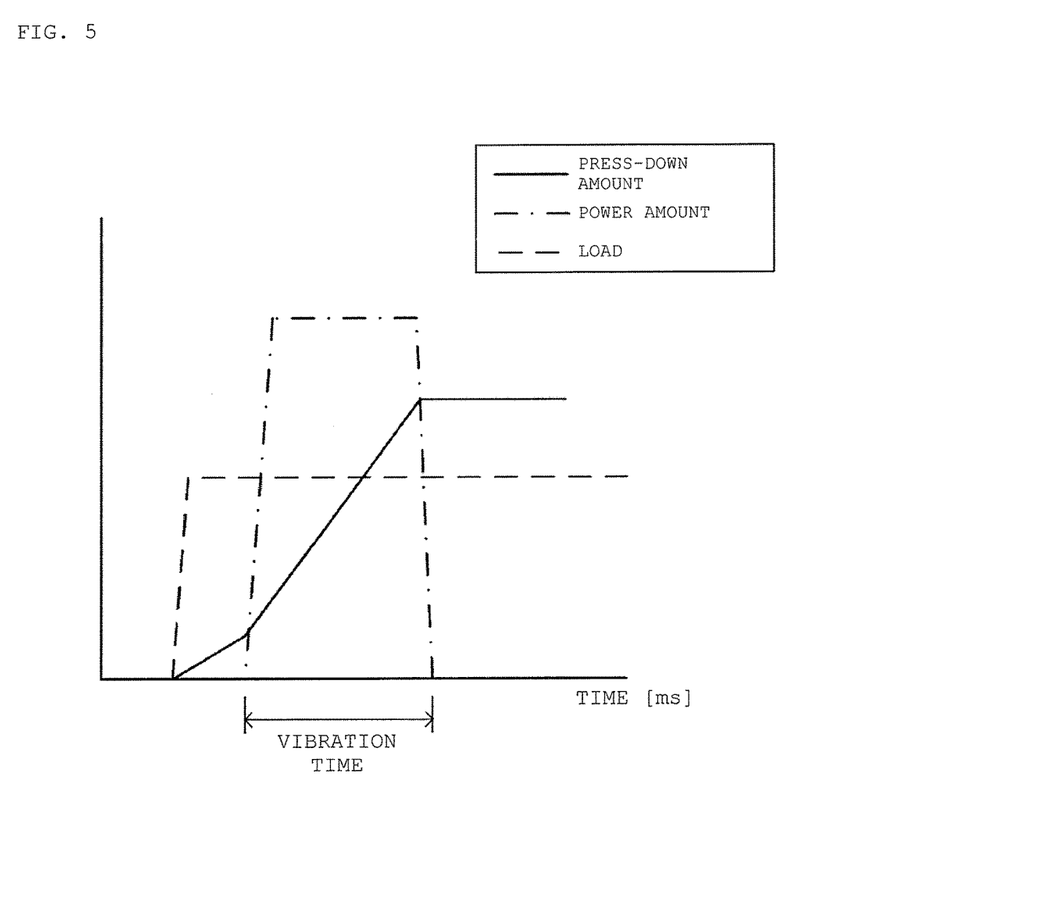
FIG. 5 is a graph showing a schematic of the press-down amount of the workpiece when the horn is driven and controlled based on a corresponding joining condition.

FIG. 5 is a graph showing a schematic of the press-down amount of the workpiece W when the horn 26 is driven and controlled based on the corresponding joining condition. FIG. 5 shows a state where the horn 26 is vibrated for a constant time while applying a constant load to the workpiece W by the horn 26 according to the corresponding joining condition. In this case, the press-down amount of the workpiece W increases with the increase of the vibration time in the range of the horn 26 vibrating. At the end of the vibration of the horn 26, the press-down amount of the workpiece W reaches a predetermined amount, and there is a correlation between the optimal joining condition and the press-down amount.

Figure 6:
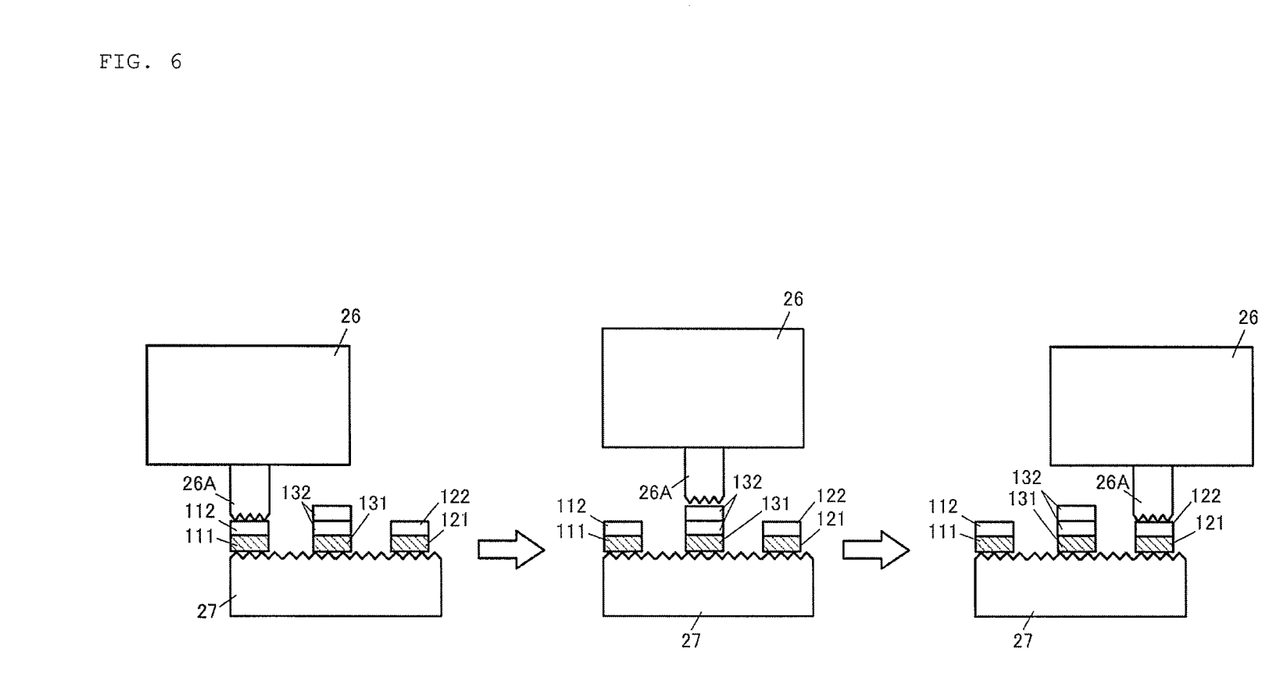
FIG. 6 is a schematic diagram showing processing of ultrasonic joining according to the first embodiment.

FIG. 6 is a schematic diagram illustrating the processing of ultrasonic joining according to the present embodiment. In the following, the processing of ultrasonic joining will be described on the assumption that the ultrasonic joining is performed in the order of the positive electrode terminal 11, the balance terminal 13 and the negative electrode terminal 12.

As shown in FIG. 6, the Cu plate 111 and the Al plate 112 forming the positive electrode terminal 11, the Cu plate 121 and the Al plate 122 forming the negative electrode terminal 12, and the Cu plate 131 and the Al plate 132 forming the balance terminal 13 are placed on the anvil 27. First, the Cu plate 111 and the Al plate 112 forming the positive electrode terminal 11 are moved between the protruding portion 26A of the horn 26 and the anvil 27 so that the protruding portion 26A, and the Cu plate 111 and the Al plate 112 face each other. Next, the anvil 27 is raised, and the position where the protruding portion 26A of the horn 26 abuts the Al plate 112 is fed back to the device.

There are various methods for grasping the abutting position on the Al plate 112, and any method may be used, however, in the present embodiment, the method by pressure detection that the position where the pressure of not less than the predetermined value is detected on the horn 26 side is determined to be the abutting position on the Al plate 112 is assumed to be used.

Next, the controller 20 obtains the optimal joining condition for the positive electrode terminal 11 from the storage unit 21. The controller 20 vibrates the horn 26 with an amplitude based on the obtained joining condition, and presses the horn 26 to the anvil 27 side. As the joining proceeds, the position of the anvil 27 is raised. It is possible to check the press-down amount by the difference between the raised position and the abutting position on the Al plate 112 which is already obtained. Thereby, the press-down amount of the workpiece W can be controlled to an optimum value (predetermined value) for the positive electrode terminal 11, and the positive electrode terminal 11 with high joining property can be manufactured.

Next, the Cu plate 131 and the Al plate 132 forming the balance terminal 13 are moved between the protruding portion 26A of the horn 26 and the anvil 27 so that the protruding portion 26A, and the Cu plate 131 and the Al plate 132 face each other. Then, the controller 20 obtains the optimal joining condition for the balance terminal 13 from the storage unit 21. The controller 20 vibrates the horn 26 with an amplitude based on the obtained joining condition, and presses the horn 26 to the anvil 27 side. Thereby, the press-down amount of the workpiece W can be controlled to an optimum value for the balance terminal 13, and the balance terminal 13 with high joining property can be manufactured.

Next, the Cu plate 121 and the Al plate 122 forming the negative electrode terminal 12 are moved between the protruding portion 26A of the horn 26 and the anvil 27 so that the protruding portion 26A, and the Cu plate 121 and the Al plate 122 face each other. The negative electrode terminal 12 has the same configuration as the positive electrode terminal 11, and therefore, the negative electrode terminal 12 with high joining property can be manufactured by performing the joining under the same joining condition as the positive electrode terminal 11.

It should be noted that although the case of performing the joining in the order of the positive electrode terminal 11, the balance terminal 13, and the negative electrode terminal 12 is described in the present embodiment, the joining may be performed from any terminal.

As described above, in the present embodiment, when the joining state of the Cu plate and the Al plate is good, the Cu plate and the Al plate are joined based on the press-down amount of the workpiece W by utilizing the fact that the press-down amount of the workpiece W tends to be in a constant range as a consequence. Thus, by driving and controlling the horn 26 appropriately and optimally for each of the plurality of terminals included in the electric double layer capacitor 1, the damage to the material to be joined and adhesion of the material to be joined to the protruding portion 26A of the horn 26 can be prevented, and sufficient joining strength of the Cu plate and the Al plate can be secured.

Second Embodiment

In the following, a second embodiment will be described. The plurality of terminals of the electric double layer capacitor 1 are joined ultrasonically one by one in the first embodiment, whereas the processing time can be shortened in the present embodiment by performing the ultrasonic joining collectively for the same type of terminals.

Figure 7:
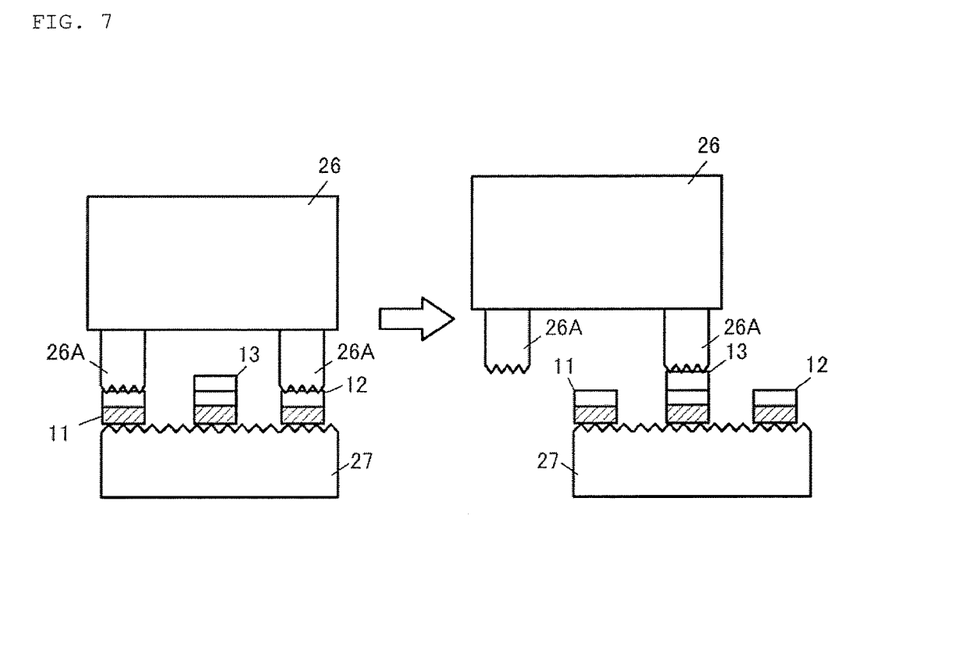
FIG. 7 is a schematic diagram showing the processing of ultrasonic joining according to a second embodiment.

FIG. 7 is a schematic diagram showing the processing of ultrasonic joining according to the present embodiment. The horn 26 of the present embodiment includes the two protruding portions 26A. The two protruding portions 26A have the same interval as between the positive electrode terminal 11 and the negative electrode terminal 12 of the electric double layer capacitor 1. It should be noted that other configurations are the same as in the first embodiment. In addition, in the present embodiment, the positive electrode terminal 11 and the negative electrode terminal 12 of the electric double layer capacitor 1 are assumed to be the same type.

The Cu plate 111 and the Al plate 112 forming the positive electrode terminal 11 and the Cu plate 121 and the Al plate 122 forming the negative electrode terminal 12 are moved between the two protruding portions 26A of the horn 26 and the anvil 27 so that the two protruding portions 26A, and the Cu plate 111 and the Al plate 112 and the Cu plate 121 and the Al plate 122 face each other. Next, the anvil 27 is raised, and the position where the protruding portions 26A of the horn 26 abut the Al plate 112 and the Al plate 122 is fed back to the device.

Next, the controller 20 obtains the optimal joining condition for the positive electrode terminal 11 and the negative electrode terminal 12 from the storage unit 21. The controller 20 vibrates the horn 26 with an amplitude based on the obtained joining condition, and presses the horn 26 to the anvil 27 side. As the joining proceeds, the position of the anvil 27 is raised. It is possible to check the press-down amount by the difference between the raised position and the abutting position on the Al plate 112 and the Al plate 122 which are already obtained. Thereby, the press-down amount of the workpiece W can be controlled to an optimum value for the positive electrode terminal 11 and the negative electrode terminal 12, and the positive electrode terminal 11 and the negative electrode terminal 12 with high joining property can be manufactured.

Next, the Cu plate 131 and the Al plate 132 forming the balance terminal 13 are moved between the protruding portion 26A of the horn 26 and the anvil 27 so that any one of the two protruding portions 26A, and the Cu plate 131 and the Al plate 132 face each other. Then, the controller 20 obtains the optimal joining condition for the balance terminal 13 from the storage unit 21. The controller 20 vibrates the horn 26 with an amplitude based on the obtained joining condition, and presses the horn 26 to the anvil 27 side. Thereby, the press-down amount of the workpiece W can be controlled to an optimum value for the balance terminal 13, and the balance terminal 13 with high joining property can be manufactured. It should be noted that in joining of the balance terminal 13, if only one of the two protruding portions 26A of the horn 26 is continued to be used, wear of the protruding portion 26A proceeds quickly, and therefore, it is preferable to use one of the two horn protruding portions 26A alternately.

As described above, in the present embodiment, a plurality of terminals can be ultrasonically joined collectively without reducing the joining property. The processing time can be shortened by performing the ultrasonic joining collectively for a plurality of terminals.

It should be noted that the specific configuration and the operation and the like of the ultrasonic joining are appropriately design changeable, and that the operation and the effect described in the above embodiments are merely listed as the most preferable operation and effect resulting from the present invention, and that the operation and the effect according to the present invention is not limited to those described in the above embodiments.

For example, the positions where the positive electrode terminal 11, the negative electrode terminal 12, and the balance terminal 13 are disposed in the container 10 are not limited to the embodiments described above. In addition, metal plates constituting the positive electrode terminal 11, the negative electrode terminal 12, and the balance terminal 13 are not limited to the Cu plate and the Al plate, and may be a Ni plate or a Ti plate or the like, in addition may be a metal plate, on the surface of which various plating is applied. In addition, each terminal is not limited to having the configuration where two metal plates are joined, and may have the configuration where more than two metal plates are joined.

The relationship between the type of terminal and the press-down amount shown in FIG. 4 is an example, and can be appropriately changed without being limited to this. For example, the relationship can be changed, by the sizes of the horn 26 and the anvil 27 (the contact area with the workpiece W) and the like, or the joint area and the like of the Cu plate and the Al plate.

Although the positive electrode terminal 11 and the negative electrode terminal 12 are assumed to be the terminals of the same type in the first embodiment, they are not limited to this combination. For example, the positive electrode terminal 11, the balance terminal 13, and the negative electrode terminal 12 may have the first structure, the second structure, and the third structure, respectively. In that case, by obtaining the first joining condition, the second joining condition, and the third joining condition which respectively correspond to the first structure, the second structure, and the third structure, from storage means that stores the joining condition for each structure of the component members of the electronic device, the respective laminated materials to be joined which correspond to the first structure, the second structure, and the third structure, may be ultrasonically joined based on the respective joining condition. In addition, although the positive electrode terminal 11 and the negative electrode terminal 12 have the same type of terminals (first structure), there may also exist a plurality of balance terminals having different structures (second and third structures). Also in this case, in the same manner, the ultrasonic joining can be performed based on the joining condition in accordance with the structure.

In the second embodiment, it is described that when the two protruding portions 26A of the horn 26 have the same interval as between the positive electrode terminal 11 and the negative electrode terminal 12 of the electric double layer capacitor 1, the positive electrode terminal 11 and the negative electrode terminal 12 are collectively joined, and the balance terminal 13 is joined using any one of the two protruding portions 26A. However, when there are two balance terminals of the same structure, and the two protruding portions 26A of the horn 26 have the same interval as between the two balance terminals, the two balance terminals also can be collectively joined.

DESCRIPTION OF REFERENCE SYMBOLS 1 electric double layer capacitor
10 container
11 positive electrode terminal (component member)
12 negative electrode terminal (component member)
13 balance terminal (component member)
20 controller
21 storage unit (storage means)
22 oscillator
23 converter
24 booster
25 pressurizing mechanism
26 horn
26A protruding portion
26B protrusions
27 anvil (supporting portion)
27A protrusions
111, 121, and 131 Cu plate
112, 122, and 132 Al plate
W workpiece (material to be joined)

The invention claimed is:
1. A method for manufacturing an electronic device including first, second and third component members extending from the electronic device, with the third component member having the same structure as the first component member, the method comprising:

accessing first and second joining conditions from an electronic storage unit for each of the first and the second component members, the respective joining conditions providing predetermined first and second press-down amounts for the first and the second component members, respectively, the respective joining conditions being based on respective thicknesses and materials of the first and second component members;

concurrently sandwiching a pair of first pluralities of plates between a pair of a plurality of protruding members of a horn, respectively, and a supporting member;

vibrating the horn to ultrasonically join each of the pair of the first pluralities of plates to form the first and third component members, respectively, each having a same first structure, wherein the vibrating causes the pair of the plurality of protruding members of the horn to respectively bite into the pair of the first pluralities of plates by the first press-down amount;

sandwiching a second plurality of plates, having at least one of a different material and a different thickness than the first pluralities of plates, between the protruding member of the horn and the supporting member; and vibrating the horn to ultrasonically join the second plurality of plates to form the second component member having a second structure different than the first structure, wherein the vibrating causes the protruding member of the horn to bite into at least one plate of the second plurality of plates by the second press-down amount that is different than the first press-down amount.

2. The method for manufacturing an electronic device according to claim 1, further comprising:

sandwiching the second plurality of plates between one of the plurality of protruding members of the horn and the supporting member; and vibrating the horn to ultrasonically join the second plurality of plates to form the second component member, wherein the vibrating causes the one protruding member of the horn to bite into the second plurality of plates by the second press-down amount for the second component member.

* * * * *